United States Patent
Sun et al.

(10) Patent No.: US 6,299,741 B1
(45) Date of Patent: Oct. 9, 2001

(54) ADVANCED ELECTROLYTIC POLISH (AEP) ASSISTED METAL WAFER PLANARIZATION METHOD AND APPARATUS

(75) Inventors: Lizhong Sun, Sunnyvale; Stan Tsai; Fritz Redeker, both of Fremont, all of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/450,858

(22) Filed: Nov. 29, 1999

(51) Int. Cl.$^7$ .................................................. C25D 17/00
(52) U.S. Cl. ................................ 204/224 M; 204/230.2
(58) Field of Search ......................... 204/224 M, 230.2

(56) References Cited

U.S. PATENT DOCUMENTS

| | | | |
|---|---|---|---|
| 4,839,005 | 6/1989 | Katsumoto et al. | 204/129.46 |
| 5,738,574 | 4/1998 | Tolles et al. | 451/288 |
| 5,807,165 | 9/1998 | Uzoh et al. | 451/41 |
| 5,911,619 | 6/1999 | Uzoh et al. | 451/5 |
| 6,004,880 | 12/1999 | Liu et al. | 438/692 |
| 6,066,030 | 5/2000 | Uzoh | 451/41 |
| 6,090,239 | 7/2000 | Liu et al. | 156/345 |

FOREIGN PATENT DOCUMENTS

WO 00/59682  10/2000  (WO).

*Primary Examiner*—Kathryn Gorgos
*Assistant Examiner*—Thomas H Parsons
(74) *Attorney, Agent, or Firm*—Perkins, Smith & Cohen

(57) ABSTRACT

In advanced electrolytic polish (AEP) method, a metal wafer (10) acts as an anodic electrodes and another metal plate (65) is used as a cathodic electrode. A voltage differential is applied to the anode and cathode under a predetermined anodic dissolution current density. This causes a reaction that provides a planarized surface on the metal wafers. Additives are included in the electrolyte solution (55) which adsorb onto the wafer surface urging a higher removal rate at higher spots and a lower removal rate at lower spots. Also, in another embodiment of the present invention is a pulsed-electrolytic process (260) in which positive and negative potentials are applied to the anodic and cathodic electrodes alternately, further encouraging surface planarization.

10 Claims, 6 Drawing Sheets

ADVANCED ELECTROLYTIC POLISH (AEP) ASSISTED METAL WAFER PLANARIZATION METHOD AND APPARATUS

CROSS-REFERENCE TO RELATED APPLICATIONS

This application is related to U.S. patent application Ser. No. 09/450,937, entitled, "Method and Apparatus for Electrochemical-Mechanical Planarization" filed on Nov. 29, 1998 pending.

BACKGROUND OF THE INVENTION

1. Field of the Invention

This invention relates generally to planarization of metal substrates and more particularly to advanced electrolytic polishing of metal films on semiconductor wafers.

2. Description of the Related Art

Integrated circuits are typically formed on substrates, particularly silicon wafers, by the sequential deposition of conductive, semiconductive or insulative layers. After a layer is deposited, the layer is etched to create circuitry features. As a series of layers are sequentially deposited and etched, the outer or uppermost surface of the substrate, i.e., the exposed surface of the substrate, becomes increasingly non-planar. This non-planar outer surface presents a problem for the integrated circuit manufacturer. Therefore, there is a need to periodically planarize the substrate surface to provide a relatively flat surface. In some fabrication processes, planarization of the outer layer should not expose underlying layers.

Chemical mechanical polishing (CMP) is a current method of planarization. This planarization method typically requires that the substrate be mounted on a carrier or polishing head. The exposed surface of the substrate is placed against a rotating polishing pad. The polishing pad may be either a "standard" pad or a fixed-abrasive pad. A fixed-abrasive pad has abrasive particles held in a containment media, whereas a standard pad has a durable surface, without embedded abrasive particles. The carrier head provides a controllable load, i.e., pressure, on the substrate to push it against the polishing pad. A polishing slurry, including at least one chemically-reactive agent, and abrasive particles if a standard pad is used, is supplied to the surface of the polishing pad.

An effective CMP process not only provides a high polishing rate, but also provides a substrate surface which is finished and flat. The polishing rate, finish and flatness are determined by the pad and slurry combination, the relative speed between the substrate and pad, and the force pressing the substrate against the pad.

In applying conventional planarization techniques, such as CMP, it is extremely difficult to achieve a high degree of surface uniformity, particularly across a surface extending from a dense array of features, for example copper lines, bordered by an open field. A dense array of metal features is typically formed in an interlayer dielectric, such as silicon oxide layer, by a damascene technique wherein trenches are initially formed. A barrier layer, such as a Ta-containing layer e.g. Ta, TaN, is then deposited lining the trenches and on the upper surface of the silicon oxide interlayer dielectric. Copper or a copper alloy is then deposited, as by electroplating, electroless plating, physical vapor deposition (PVD) at a temperature of about 50° C. to about 150° C. or chemical vapor deposition (CVD) at a temperature under about 200° C., typically at a thickness of about 8000 Å to about 18,000 Å. In planarizing the wafer surface after copper metallization using CMP, undesirable erosion and dishing typically occur, decreasing the degree of surface uniformity or planarity and challenging the depth of focus limitations of conventional photolithographic techniques, particular with respect to achieving submicron dimensions, such as about 0.25 micron. Erosion is defined as the height differential between the oxide in the open field and the height of the oxide within the dense array. Dishing is defined as a difference in height between the oxide and Cu within the dense array.

Dishing and erosion formation are the most important parameters in evaluating metal CMP processes. Current processes using CMP generate at best 600–800 Å dishing and 400–1500 Å erosion, depending on the pattern density on the substrate. There are generally two causes for dishing formation: a) insufficient planarization and b) over-polish. CMP accomplishes planarization, but the efficiency of the planarization decreases significantly as the feature size increases on the substrate. Over-polish is performed to remove metal residue from a wafer's surface after CMP. Over-polish contributes significantly to dishing and erosion formation, especially when over-polish is done at a relatively high polish rate in order to have high throughput. Past efforts to improve dishing and erosion included modifications to the slurry, polishing pad and the process.

It remains desirable to have a process of planarization where dishing and erosion are decreased.

It is an advantage of the present invention to provide a method and apparatus for substrate planarization producing a good quality substrate surface with high throughput.

SUMMARY OF THE INVENTION

The problems of reducing dishing and erosion while achieving planarized processed substrates are solved by the present invention of an advanced electrolytic polish (AEP) assisted metal wafer planarization method and apparatus.

The advanced electrolytic polish (AEP) method polishes the metal surface of a layered substrate in a controlled way so that higher spots are removed more quickly than lower spots in the surface topography. AEP uses a reverse electroplating method along with surface modifying methods, either alone or in combination, to remove material from a substrate in order to planarize the substrate. A first surface modifying method is to include surface modifying additives in the electrolyte solution used for AEP. A second surface modifying method is pulsed electrolysis with application of alternating positive and negative potentials, in which the potential across the electrodes in AEP is periodically reversed causing high points on the substrate surface to be removed before low points on the substrate surface. Additives and pulsed electrolysis can be combined in an AEP process.

The polish in the present embodiment of the invention stops when a barrier layer (e.g.tantalum, tantalum nitride, titanium or titanium nitride) is substantially removed. Alteration of the electrolyte chemistry of the present invention, however, would alter the depth and the layers removed in the polish. Additives to the electrolyte solution, and the application of pulsed voltage during electrolytic polish further improve the planarity of the substrate polished surface.

In the AEP method herein described, substrates act as anodic electrodes and another metal plate is used as a cathodic electrode. The substrate and the cathode are configured in either an electroplating tank or in an adapted chemical mechanical polishing device. A voltage differential is applied to the anode and cathode under a predetermined anodic dissolution current density. This causes a reaction that provides a planarized surface on the metal wafers. Current electrolytic polishing methods generally leave at least 500 Å difference between high and low spots in the wafer surface topography. With the present advanced electrolytic polish, additives are included in the electrolyte solution which adsorb onto the wafer surface urging a higher removal rate at higher spots and a lower removal rate at lower spots. Also, another embodiment of the present invention is a pulsed-electrolytic process in which positive and negative potentials are applied to the anodic and cathodic electrodes alternately, further encouraging surface planarization. A further embodiment of the invention involves using the additive method and the pulsed method in combination.

AEP can be used either as a first step followed by a short mechanical polishing step (buffing) to remove the thin barrier layer (250 Å); or as a second step between an initial CMP polish with about 2000 Å copper layer remaining and a third step mechanical polish. The present invention may also be added as a last step of copper electroplating process and so may be used in the manufacture of all kinds of patterned metal wafers.

With the AEP technique, the "insufficient planarization" problem that occurs in normal CMP processes is substantially eliminated, the first CMP step is much easier, and dishing and erosion caused by the over-polishing step are avoided. AEP eliminates erosion because there is no mechanical action during the AEP process. This is particularly important in processing wafers having high density surface patterns where there is a high potential for erosion. Dishing is greatly decreased with the chemical additives and the pulsed current. The AEP method provides a planarized surface without erosion and with very little dishing.

The present invention together with the above and other advantages may best be understood from the following detailed description of the embodiments of the invention illustrated in the drawings.

DETAILED DESCRIPTION OF PREFERRED EMBODIMENTS

Figure 1:
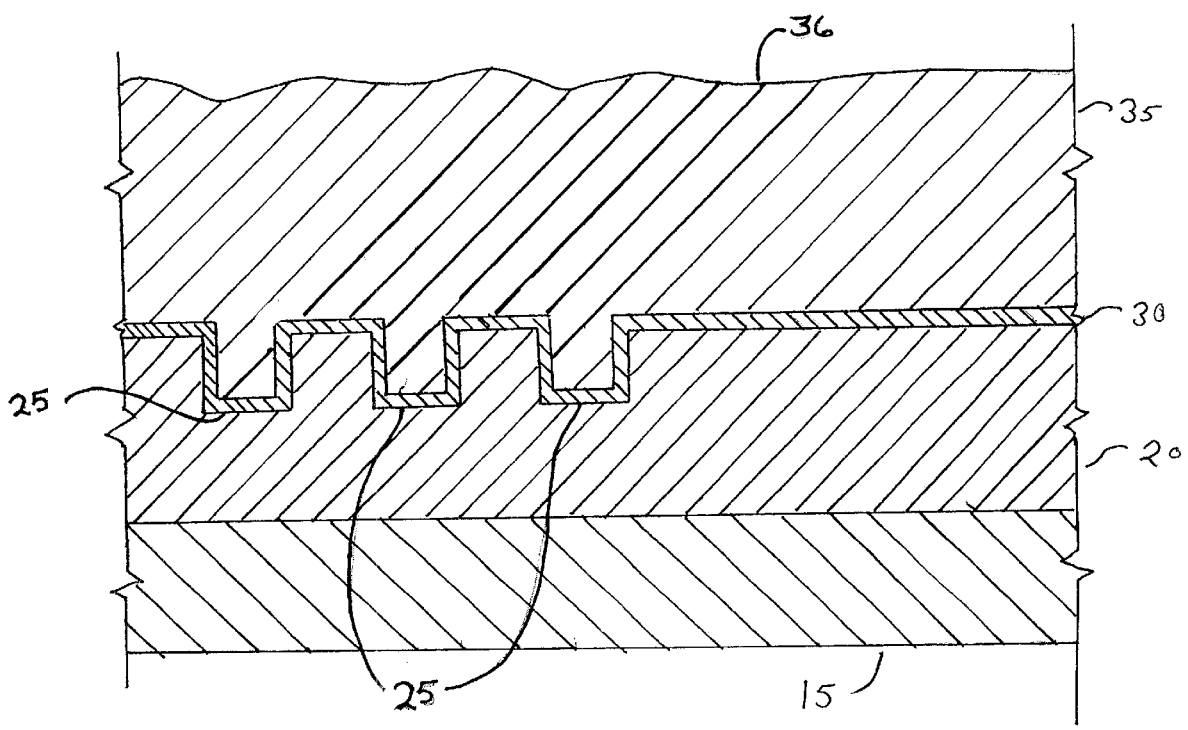
FIG. 1 is a cross-sectional view of a substrate with a plurality of layers.

FIG. 1 shows a cross-sectional view of a conductive substrate 10 having deposited layers such as those layers formed during the manufacture of semiconductors. The figure is not to scale. An interlayer dielectric 20, e.g. silicon oxide, is formed overlying a metal wafer 15. A plurality of indentations, also referred to as openings 25, are formed in a designated area at the left of the interlayer dielectric 20 in which a dense array of conductive lines are to be formed bordering an open field shown on the right of the interlayer dielectric 20. A barrier layer 30, e.g. tantalum, tantalum nitride, titanium or titanium nitride, is deposited on the layer of interlayer dielectric 20, the barrier layer 30 also lining the plurality of openings 25. A conductive layer 35, e.g. copper, is then deposited over the barrier layer 30. The successive layers form an uneven topography 36 over the substrate which requires planarization before further processing. Also, successive process steps require that portions of the conductive layer be removed. Planarization and selective removal of the conductive layer are accomplished in a polishing step.

Figure 2:
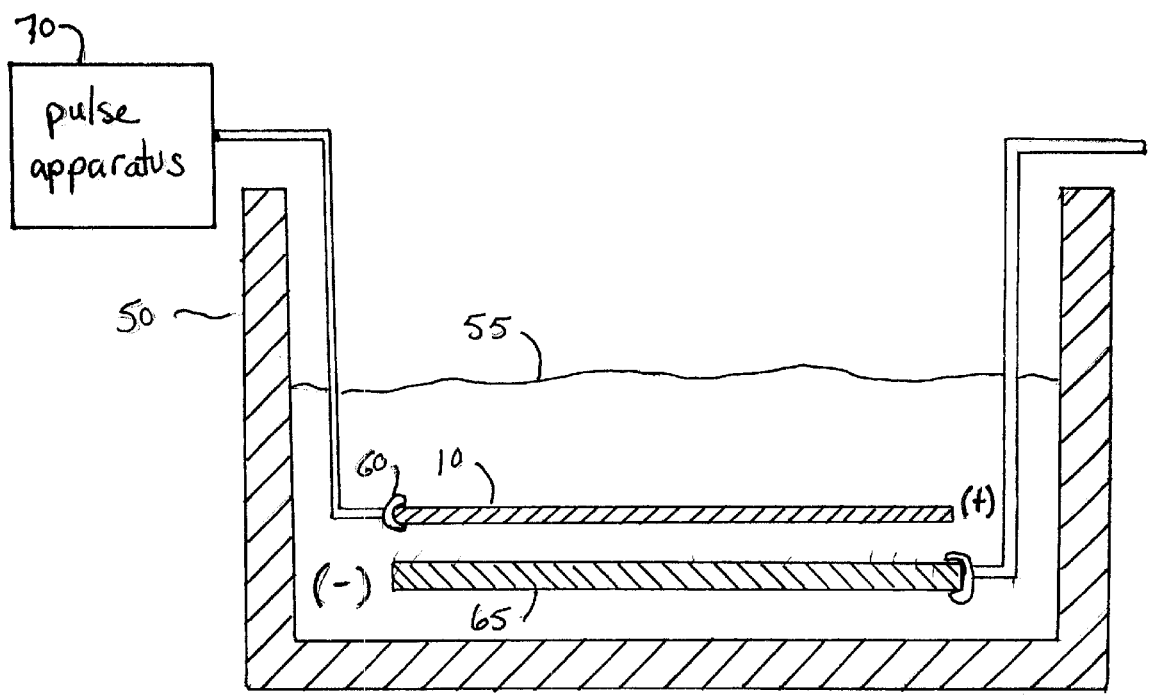
FIG. 2 is a cross-sectional view of a first embodiment of an advanced electrolytic polish device wherein a wafer is immersed in a tank having an electrolyte solution according to principles of the present invention.

FIG. 2 shows a side cross-sectional view of an electrolyzer in a first embodiment of the present invention of advanced electrolytic polishing (AEP). The conductive substrate 10 of FIG. 1 is immersed in a tank 50 containing a solution 55 of electrolytes. The conductive substrate 10 is connected to a conductive clamp 60 to form a first electrode, an anode. A second electrode 65, a cathode matching the metal substrate is also immersed in the tank 50. A voltage differential is applied to the anode and cathode under a predetermined anodic dissolution current density. The current density is typically 1–30 mA/cm$^2$. This causes a reaction that provides a planarized surface on conductive substrates. The reaction when the barrier layer is substantially exposed leaves a planarized surface on the substrate having conductive areas and substantially exposed barrier layer. Current electrolytic polishing methods generally leave at least 500 Å difference between high and low spots in the wafer surface topography.

Additives are included in the electrolyte solution which adsorb onto the substrate surface urging a higher removal rate at higher spots and a lower removal rate at lower spots. The additives are generally less than 1% of the electrolyte solution by weight. The additives are surface modifiers. The adsorbed additives act as electric discharge points that modify the surface of the substrate so that high spots are polished first and then low spots are polished. Examples of additives used in this process are coumarin ($C_9H_6O_2$), sulfourea ($CS(NH_2)_2$), and $R-C_6H_5-O-(CH_3CH_2O)_n$, where $R=C_8-C_9$, and n=10. Other additives and concentrations are possible within the scope of the present invention.

Also, in an alternative embodiment of the present invention, a pulsed-electrolytic process is applied, using a pulse apparatus 70, in which positive and negative potentials are applied between the anodic and cathodic electrodes alternately, further encouraging surface planarization. The pulse apparatus may be an alternator, or a potentiostat with pulsing capability. In this method, a current density typically in the range of 1–30 mA/cm$^2$, for example, is applied typically for a few milliseconds. The pulse-polish modifies the surface of the substrate. Material from high spots on the surface is redeposited to low spots on the surface. This is a useful surface modification in those cases where planarization is not sufficient.

Figure 3:
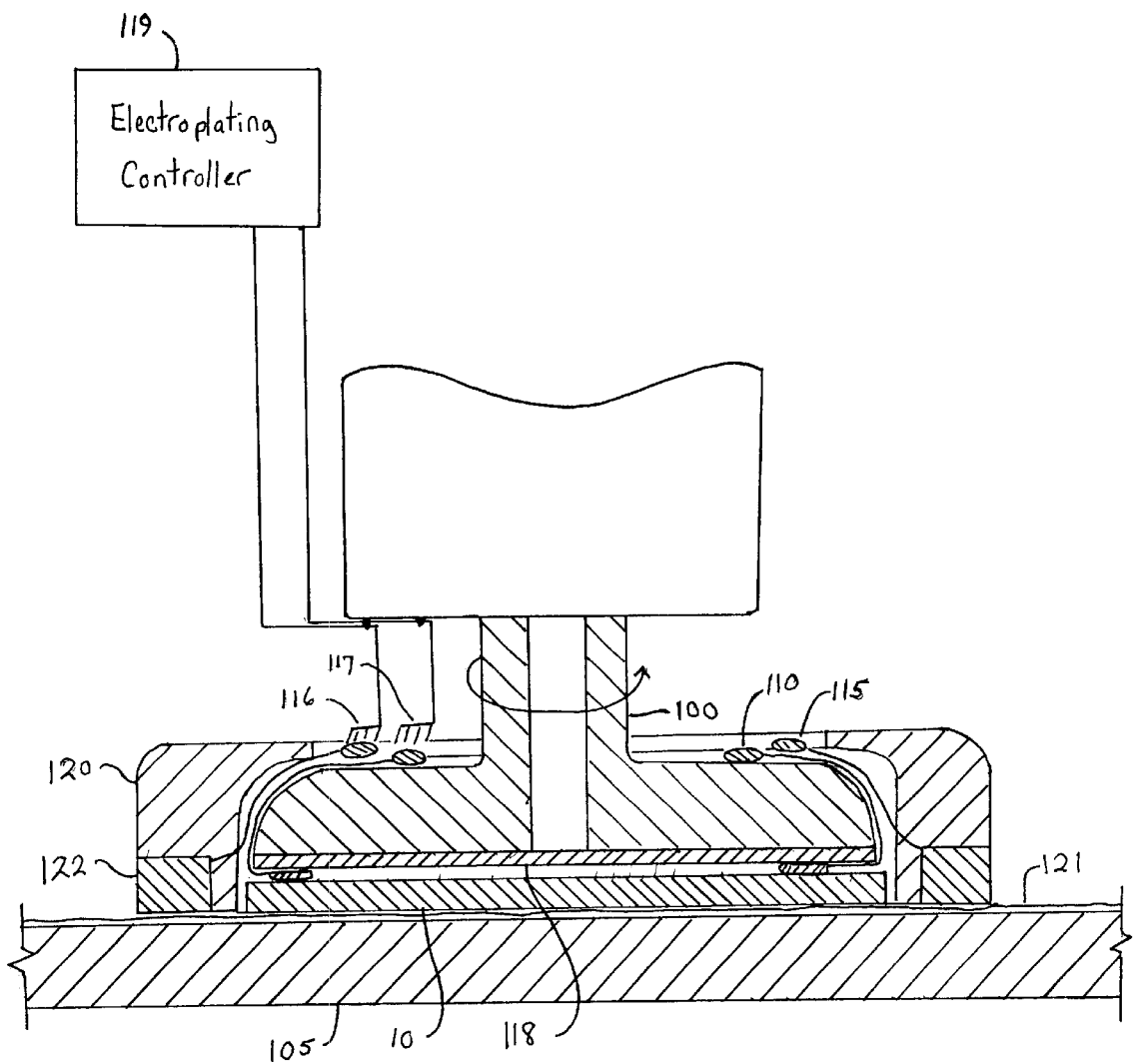
FIG. 3 is a simplified cross-sectional view of a second embodiment of an advanced electrolytic polish device wherein a polishing head contains anodes and a cathode according to principles of the present invention.

FIG. 3 shows a simplified, part cross-sectional, part schematic, side view of an even further embodiment of the present invention of AEP. In FIG. 3, a polish head 100 rests on a polish pad 105 with the metal substrate 10 of FIG. 1 in between the head 100 and the pad 105. An anodic connection 110 and a cathodic connection 115 are provided. The anodic connection contacts the substrate 10 such that the substrate becomes an anode. In the present embodiment of the invention, the anodic 110 and cathodic 115 connections form rings around the head inside the retaining ring 120. A membrane 118 between the polish head and the substrate 10 provides pressure to maintain the contact between the anodic connection 110 and the substrate 10 and between the substrate 10 and polish pad 105. First 116 and second 117 brushes provide electrical connection from connections 110, 115 to an electrolysis controller 119. The electrolysis controller 119 may include a pulse apparatus 70 such as that shown in FIG. 2. A metal portion of the retaining ring 120 acts as a cathode 122. The placement of anodes 110, 115 and the cathode 122 are merely exemplary. Other configurations are possible within the scope of the present invention.

The pad 105 is wetted with electrolyte solution 121. A slurry arm 225 (shown in FIG. 4) having tubes for slurry, in this case for electrolyte solution, extends over the polishing pad 105. A voltage differential is applied to the anode substrate 10 and the cathode 122. This causes a reaction that provides a planarized surface on the conductive substrate. The head 100 spins in order to carry polishing product away from the wafer 10, however, mechanical polishing does not take place. Additives are added to the electrolyte solution with the same effect as described above. No abrasion of the wafer is necessary in order to accomplish the polishing. The pulse polish technique may also be used in this configuration.

Figure 4:
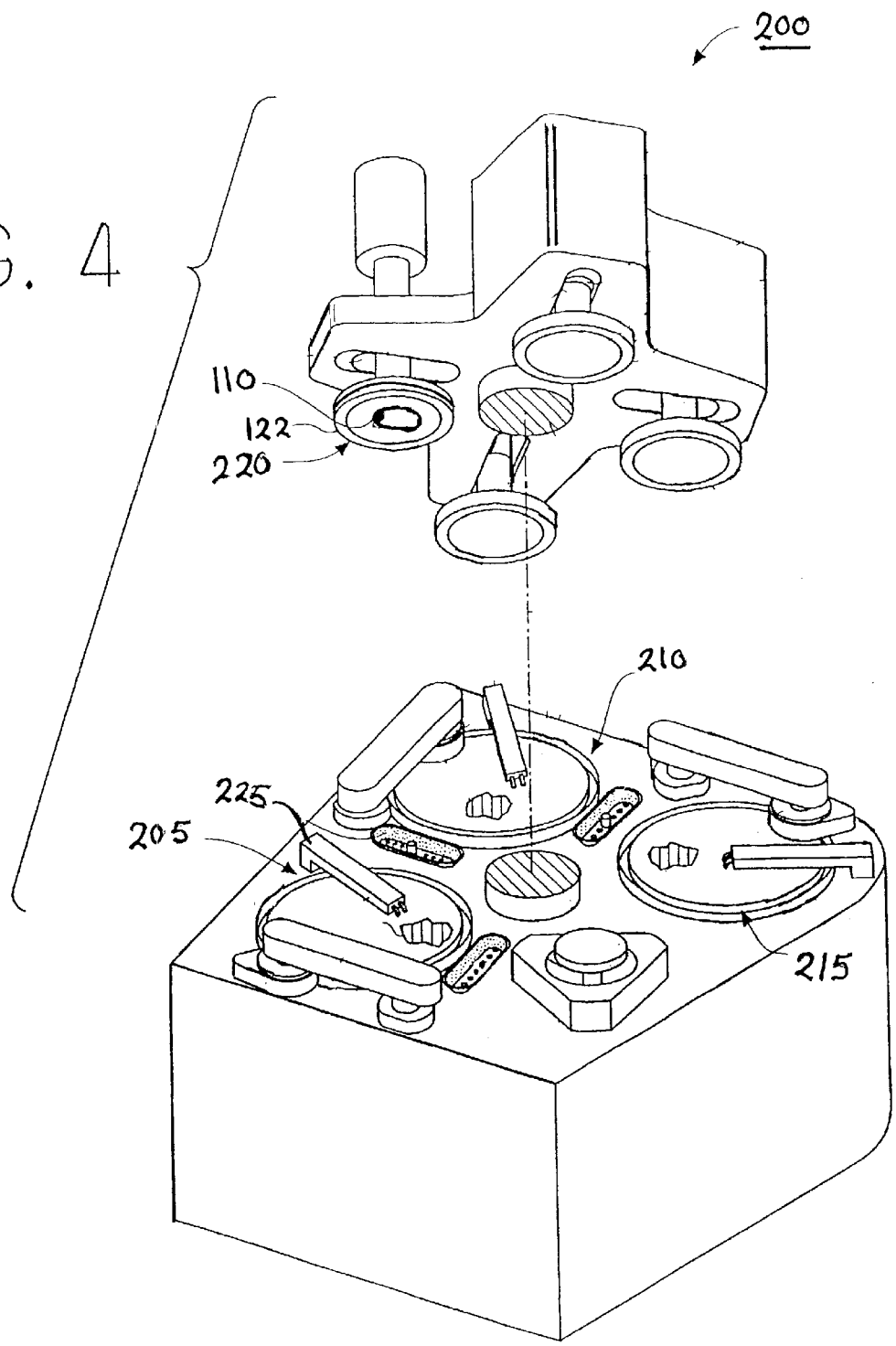
FIG. 4 is a schematic exploded view of a chemical mechanical polishing apparatus.

FIG. 4 shows a chemical mechanical polishing apparatus 200 having a plurality of polishing stations 205, 210, 215. One of the polish heads on the apparatus 200 has modifications as shown in FIG. 3 in order to accomplish the present invention. The head 220 of polishing station 205 has an anodic connection 110, and a cathode 122 as seen in FIG. 3. Slurry arm 225 delivers electrolyte solution to the polishing pad 105. Alternatively, one or more of the polishing stations could be modified with the electrochemical cell shown in FIG. 2 in order to accomplish the present invention.

Figure 5:
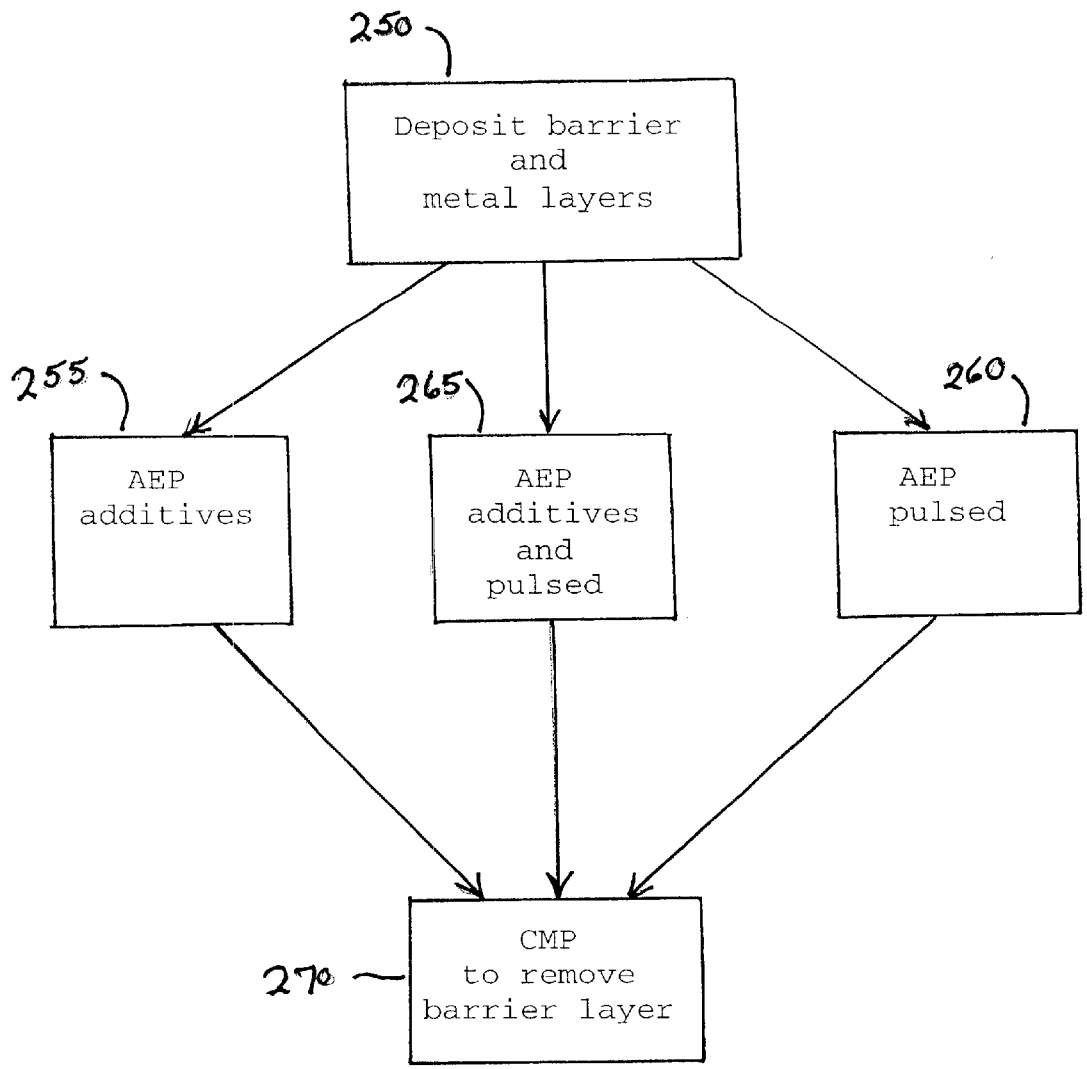
FIG. 5 is a flow chart of a first embodiment of a polishing step using AEP according to principles of the present invention; and, FIG. 6 is a flow chart of a second embodiment of a polishing step using AEP according to principles of the present invention.

FIG. 5 is a flow chart of a first embodiment of a polishing step using AEP according to principles of the present invention. After the barrier layer and the metal layer have been deposited on the wafer, block 250, AEP is applied to planarize the wafer. The planarization may be accomplished by AEP using additives, block 255, AEP using pulsed current, block 260, or AEP using both additives and pulsed current, block 265. Then CMP is applied to the wafer to remove the barrier layer, block 270.

Figure 6:
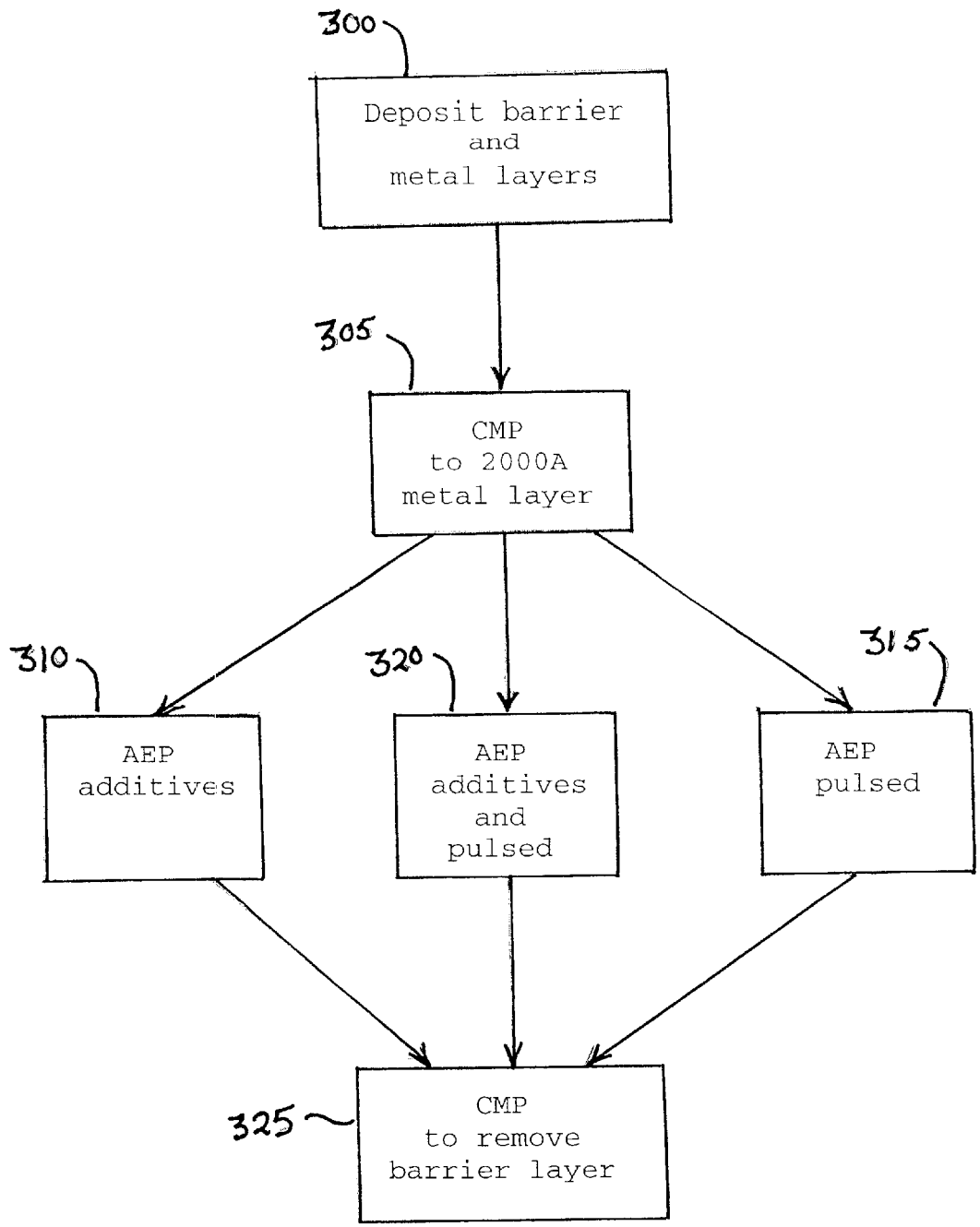

FIG. 6 is a flow chart of a second embodiment of a polishing step using AEP according to principles of the present invention. After the barrier layer and the metal layers have been deposited on the wafer, block 300, CMP is applied, block 305, until a thin film of metal of a predetermined thickness remains, for example 2000 Å. Then AEP is applied to remove the remaining metal and to planarize the surface of the wafer. The AEP process may be AEP using additives, block 310, AEP using pulsed current, block 315, or AEP using both additives and pulsed current, block 320. CMP is then applied to the wafer to remove the barrier layer, block 325.

It is to be understood that the above-described embodiments are simply illustrative of the principles of the invention. Various and other modifications and changes may be made by those skilled in the art which will embody the principles of the invention and fall within the spirit and scope thereof.

What is claimed is:

1. A chemical mechanical polishing (CMP) apparatus adapted for advanced electrolytic polishing (AEP) of a substrate, comprising:

an anode located in a polishing head of said CMP apparatus, said anode contacting the substrate held in said polishing head;

a cathode located in said polishing head, said cathode offset from said anode;

a polishing pad wetted with an electrolyte solution, said electrolyte solution and the substrate providing a connection between said anode and said cathode; and, an electrolysis controller to provide a potential across said anode and said cathode, said electrolysis controller alternating said potential between positive and negative, whereby said substrate is planarized without mechanical action of the CMP apparatus.

2. The apparatus of claim 1 wherein said electrolyte solution further comprises an additive to urge higher removal rates at higher spots on the substrate surface and lower removal rates at lower spots on the substrate surface.

3. The apparatus of claim 1 wherein said electrolysis controller further comprises a pulse apparatus for alternating said potential.

4. The apparatus of claim 1 wherein said anode further comprises a ring around said polishing head forming an anodic connection from said electrolysis controller to said substrate.

5. The apparatus of claim 1 wherein said cathode is a portion of a retaining ring in said polishing head.

6. A chemical mechanical polishing (CMP) apparatus adapted for advanced electrolytic polishing (AEP) of a substrate, comprising:

an anode located in a polishing head of said CMP apparatus, said anode contacting a substrate held in said polishing head;

a cathode located in said polishing head, said cathode offset from said anode; and a polishing pad wetted with an electrolyte solution, said electrolyte solution having an additive to urge higher removal rates at higher spots on the substrate surface and lower removal rates at lower spots on the substrate surface, said electrolyte solution providing a electrical connection between said anode and said cathode;

an electrolysis controller to provide a potential across said anode and said cathode, whereby said substrate is planarized without mechanical action of the CMP apparatus.

7. The apparatus of claim 6 wherein said additive is coumarin.

8. The apparatus of claim 6 wherein said additive is sulfourea.

9. The apparatus of claim 6 wherein said additive is $C_8-C_6H_5-O-(CH_3CH_2O)_{10}$.

10. The apparatus of claim 6 wherein said additive is $C_9-C_6H_5-O-(CH_3CH_2O)_{10}$.

* * * * *